(12) United States Patent
Mizuno et al.

(10) Patent No.: US 8,815,112 B2
(45) Date of Patent: Aug. 26, 2014

(54) LIQUID PROCESSING METHOD, RECORDING MEDIUM HAVING RECORDED PROGRAM FOR EXECUTING LIQUID PROCESSING METHOD THEREIN AND LIQUID PROCESSING APPARATUS

(75) Inventors: Tsuyoshi Mizuno, Koshi (JP); Hiromitsu Namba, Koshi (JP); Yuichiro Morozumi, Nirasaki (JP); Shingo Hishiya, Nirasaki (JP); Katsushige Harada, Nirasaki (JP); Fumiaki Hayase, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 365 days.

(21) Appl. No.: 13/223,543

(22) Filed: Sep. 1, 2011

(65) Prior Publication Data

US 2012/0067846 A1    Mar. 22, 2012

(30) Foreign Application Priority Data

Sep. 17, 2010 (JP) ................................. 2010-210009

(51) Int. Cl.
| | | |
|---|---|---|
| *C25F 3/00* | (2006.01) | |
| *C23F 1/08* | (2006.01) | |
| *H01L 21/67* | (2006.01) | |
| *H01L 21/02* | (2006.01) | |
| *H01L 21/687* | (2006.01) | |

(52) U.S. Cl.
CPC ............. *C23F 1/08* (2013.01); *H01L 21/6708* (2013.01); *H01L 21/0209* (2013.01); *H01L 21/02087* (2013.01); *H01L 21/68792* (2013.01); *H01L 21/68785* (2013.01)
USPC ........................................... 216/100; 216/83

(58) Field of Classification Search
None
See application file for complete search history.

(56) References Cited

U.S. PATENT DOCUMENTS

| 7,105,458 | B1 * | 9/2006 | Tai ................................. 438/742 |
| 2002/0060202 | A1 * | 5/2002 | Fukunaga et al. ............... 216/88 |
| 2002/0177310 | A1 * | 11/2002 | Asaoka et al. ................ 438/689 |
| 2008/0286697 | A1 * | 11/2008 | Verhaverbeke et al. ....... 430/322 |

FOREIGN PATENT DOCUMENTS

| JP | 2000-235948 A | 8/2000 |
| JP | 2005-097715 A | 4/2005 |

* cited by examiner

*Primary Examiner* — Shamim Ahmed
*Assistant Examiner* — Bradford Gates
(74) *Attorney, Agent, or Firm* — Abelman, Frayne & Schwab

(57) ABSTRACT

Disclosed is a method for processing a substrate including a first process and a second process. The first process comprises supporting the substrate formed with a titanium-containing film on its front surface and rear surface by a support unit which is rotatably installed; rotating the substrate along with the support unit; and supplying a first processing liquid containing hydrofluoric acid to the rear surface of the substrate thereby processing the rear surface of the substrate with the first processing liquid. The second process comprises supplying a second processing liquid containing ammonia hydrogen peroxide mixture to the rear surface of the substrate after the first process is completed, thereby processing the rear surface of the substrate with the second processing liquid.

9 Claims, 12 Drawing Sheets

FIG. 10A

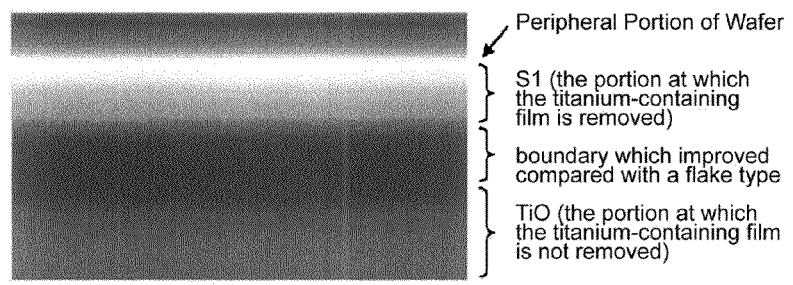

- Peripheral Portion of Wafer
- S1 (the portion at which the titanium-containing film is removed)
- boundary which improved compared with a flake type
- TiO (the portion at which the titanium-containing film is not removed)

FIG. 10B

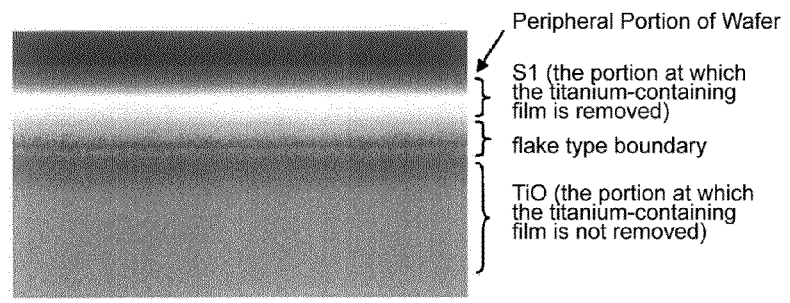

- Peripheral Portion of Wafer
- S1 (the portion at which the titanium-containing film is removed)
- flake type boundary
- TiO (the portion at which the titanium-containing film is not removed)

LIQUID PROCESSING METHOD, RECORDING MEDIUM HAVING RECORDED PROGRAM FOR EXECUTING LIQUID PROCESSING METHOD THEREIN AND LIQUID PROCESSING APPARATUS

CROSS-REFERENCE TO RELATED APPLICATIONS

This application is based on and claims priority from Japanese Patent Application No. 2010-210009 filed on Sep. 17, 2010 with the Japanese Patent Office, the disclosure of which is incorporated herein in its entirety by reference.

TECHNICAL FIELD

The present disclosure relates to a liquid processing method, a recording medium having a recorded program for executing the liquid processing method therein and a liquid processing apparatus.

BACKGROUND

In a process of manufacturing a semiconductor device or a flat panel display (FPD), a liquid process is often used for processing a target substrate such as a semiconductor wafer or a glass substrate by supplying a processing liquid thereto.

Such a liquid process includes, for example, a liquid process wherein a processing liquid is supplied to the rear surface of a substrate, thereby processing the substrate.

For example, in a process of manufacturing semiconductor devices, a deposition process may be performed to form various thin films on a top surface of a substrate which is a circuit forming surface. In the deposition process, a thin film is sometimes deposited on a rear surface which is not a circuit forming surface, as well as the top surface of the substrate. The thin film formed on the rear surface of the substrate needs to be removed, since it may cause the substrate to be bent in subsequent processes, for example, when a thermal processing is performed. In this case, a liquid process may be performed, in which a processing liquid is supplied to the rear surface of the substrate, and the rear surface is subjected to an etching processing by the processing liquid.

Japanese Patent Application Laid-Open No. 2000-235948 discloses a liquid processing apparatus for processing the bottom surface of a substrate by supplying a processing liquid to the bottom surface. The apparatus for processing a substrate disclosed in Japanese Patent Application Laid-Open No. 2000-235948 includes a substrate holding means (support unit), a first driving means (rotating unit) and an etchant supplying means (processing liquid supplying unit). The substrate holding means holds the substrate to be supported horizontally. The first driving means rotates the substrate held by the substrate holding means around a shaft center. The etchant supplying means supplies a processing liquid to the bottom surface of the substrate that is being rotated by the first driving means.

Further, Japanese Patent Application Laid-Open No. 2005-97715 discloses an etchant containing hydrofluoric acid used as a processing liquid for removing a titanium-containing film formed on a top surface and a bottom surface of a substrate by an etching processing.

SUMMARY

An exemplary embodiment of the present disclosure provides a method for processing a substrate including a first process and a second process. The first process comprises supporting the substrate formed with a titanium-containing film on its front surface and rear surface by a support unit which is rotatably installed; rotating the substrate along with the support unit; and supplying a first processing liquid containing hydrofluoric acid to the rear surface of the substrate thereby processing the rear surface of the substrate with the first processing liquid. The second process comprises supplying a second processing liquid containing ammonia hydrogen peroxide mixture to the rear surface of the substrate after the first process is completed, thereby processing the rear surface of the substrate with the second processing liquid.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 10 is a diagram comparing the photograph of the surface of a wafer after liquid processing method according to the exemplary embodiment of the present disclosure with the photograph of the surface of a wafer after liquid processing method according to Comparative Example 1.

DETAILED DESCRIPTION

Figure 1:
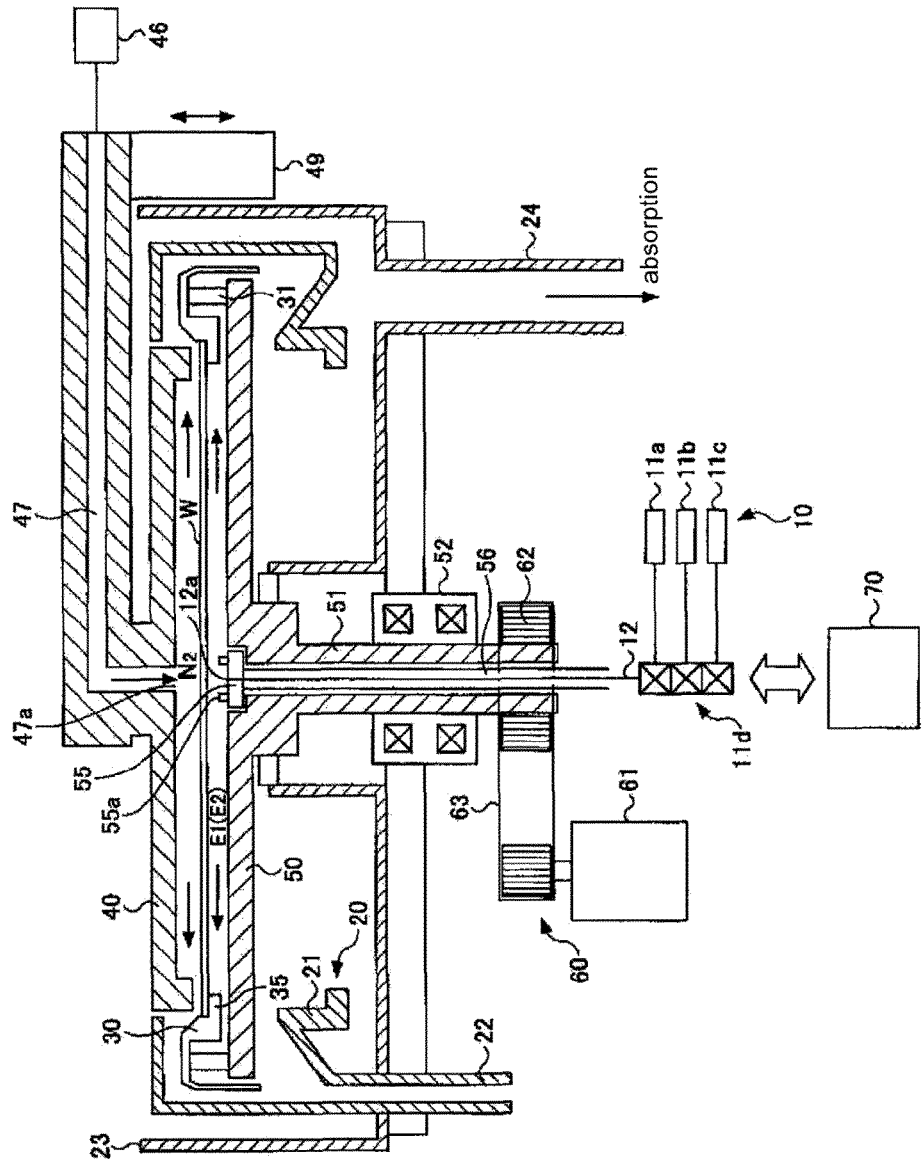
FIG. 1 is a schematic cross sectional view showing the configuration of a liquid processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Following problems exist in the liquid processing method and the liquid processing apparatus for removing a titanium-containing film from the rear surface of the substrate formed with the titanium-containing film on its front surface and rear surface by using an etchant containing hydrofluoric acid as a processing liquid.

In the case of supplying the processing liquid containing hydrofluoric acid to the rear surface of the substrate that is rotating to remove the titanium-containing film from the rear surface, although the thickness of the titanium-containing film on the rear surface becomes approximately zero, the amount of titanium elements detected by elemental analysis does not reduce to the allowable amount or less. Therefore, in order to reduce the detection value of titanium elements to a predetermined value or less, the rear surface of the substrate needs to be further subjected to liquid processing for a long time after the thickness of the titanium-containing film becomes approximately zero. That is, it has been found out that, when removing the titanium-containing film from the rear surface of the substrate formed with the titanium-containing film on its front surface and rear surface, it is difficult to remove titanium elements remaining on the rear surface in a short time.

The present disclosure has been made in consideration of the problems described above to provide a liquid processing method and a liquid processing apparatus in which, when removing the titanium-containing film from the rear surface of the substrate formed with the titanium-containing film on its top surface and rear surface, titanium elements can be removed in a shorter time than in prior arts.

The present disclosure provides following means necessary for solving the problems described above.

An exemplary embodiment of the present disclosure provides a method for processing a substrate including a first process and a second process. The first process comprises supporting the substrate formed with a titanium-containing film on its front surface and rear surface by a support unit which is rotatably installed; rotating the substrate along with the support unit; and supplying a first processing liquid containing hydrofluoric acid to the rear surface of the substrate thereby processing the rear surface of the substrate with the first processing liquid. The second process comprises supplying a second processing liquid containing ammonia hydrogen peroxide mixture to the rear surface of the substrate after the first process is completed, thereby processing the rear surface of the substrate with the second processing liquid.

In the method of the present disclosure, the first process is removing the titanium-containing film from the rear surface of the substrate by the first processing liquid, and the second process is removing the titanium element remaining on the rear surface of the substrate from which the titanium-containing film is removed, by the second processing liquid. Here, the rear surface is a bottom surface of the substrate, and the front surface is a top surface of the substrate.

In the method of the present disclosure, the first process is allowing the first processing liquid supplied to the bottom surface to detour from the bottom surface to the top surface of the substrate, thereby processing a peripheral portion of the top surface with the first processing liquid; and the second process is allowing the second processing liquid supplied to the bottom surface to detour from the bottom surface to the top surface of the substrate, thereby processing the peripheral portion of the top surface with the second processing liquid. Further, the method of present disclosure further comprises a third process comprising supplying a third processing liquid containing ammonia hydrogen peroxide mixture to a peripheral portion of the rotating substrate, thereby processing the peripheral portion of the top surface with the third processing liquid.

Further, in the method of the present disclosure, the first process is rotating the substrate along with the support unit at a first rotation speed, and supplying the first processing liquid to the bottom surface of the substrate rotating at the first rotation speed in the first process; and the second process is rotating the substrate along with the support unit at a second rotation speed lower than the first rotation speed, and supplying the second processing liquid to the bottom surface of the substrate rotating at the second rotation speed in the second process.

Further, the present disclosure provides a non-transitory computer-readable recording medium storing a computer executable program that, when executed, causes a computer to perform the method of the present disclosure described above.

Further, another exemplary embodiment of the present disclosure provides an apparatus for processing a substrate which comprises a support unit rotatably installed and configured to support the substrate; a rotating unit configured to rotate the support unit; a first processing liquid supplying unit configured to supply a first processing liquid containing hydrofluoric acid to the rear surface of the substrate supported by the support unit; a second processing liquid supplying unit configured to supply a second processing liquid containing ammonia hydrogen peroxide mixture to the rear surface of the substrate supported by the support unit; a first opening/closing mechanism configured to switch between the first processing liquid supplying unit and the second processing liquid supplying unit; and a control unit configured to control the rotating unit and the first opening/closing mechanism. In particular, the control unit controls the rotating unit and the first opening/closing mechanism so as to support the substrate formed with a titanium-containing film on its front surface and rear surface by a support unit, rotate the substrate along with the support unit by the rotating unit, supply the first processing liquid to the rear surface of the rotating substrate by the first processing liquid supplying unit, and, after processing with the first processing liquid, supply the second processing liquid to the rear surface of the rotating substrate by the second processing liquid supplying unit.

In the apparatus of the present disclosure, the titanium-containing film is removed from the rear surface of the substrate by the first processing liquid, and the titanium element remaining on the rear surface of the substrate from which the titanium-containing film is removed, is removed by the second processing liquid. Here, the rear surface is a bottom surface of the substrate, and the front surface is a top surface of the substrate.

Further, in the apparatus of the present disclosure, the control unit controls the rotating unit and the first opening/closing mechanism so as to rotate the substrate along with the support unit at a first rotation speed, supply the first processing liquid to the bottom surface of the substrate rotating at the first rotation speed, allow the first processing liquid supplied to the bottom surface to detour from the bottom surface to the top surface of the substrate, process a peripheral portion of the top surface with the first processing liquid after processing with the first processing liquid, rotate the substrate along with the support at a second rotation speed lower than the first rotation speed, supply the second processing liquid to the bottom surface of the substrate rotating at the second rotation speed, allow the second processing liquid supplied to the bottom surface to detour from the bottom surface to the top surface of the substrate, and process the peripheral portion of the top surface with the second processing liquid.

Further, the apparatus of the present disclosure further comprises a third processing liquid supplying unit configured to supply a third processing liquid containing ammonia hydrogen peroxide mixture to a peripheral portion of the substrate supported by the support unit; and a second opening/closing mechanism configured to switch supplying of the third processing liquid from the third processing liquid supplying unit, wherein the control unit controls the second opening/closing mechanism so as to supply the third processing liquid to the peripheral portion of the rotating substrate by the third processing liquid supplying unit, thereby processing the peripheral portion of the top surface with the third processing liquid.

According to the present disclosure, when removing the titanium-containing film from the rear surface of the substrate formed with the titanium-containing film on its front surface and rear surface, titanium elements remaining on the rear surface can be removed in a short time.

Next, exemplary embodiments of the present disclosure will be described with reference to the accompanying drawings. Here, the present disclosure will be described with regard to a liquid processing apparatus for processing a rear surface of semiconductor wafer (hereinafter, simply referred to as a "wafer"), which is not a circuit forming surface.

Exemplary Embodiment

First, with reference to FIGS. 1 to 3, the liquid processing apparatus according to the exemplary embodiment of the disclosure will be described. The liquid processing apparatus according to the exemplary embodiment of the present disclosure supplies a processing liquid to a bottom surface of a target to be processed, such as a semiconductor wafer W (hereinafter, referred to as "wafer W"), thereby processing the bottom surface of wafer W.

FIG. 1 is a schematic cross sectional view showing the configuration of a liquid processing apparatus 100 according to an exemplary embodiment of the present disclosure. FIG. 2 is a schematic cross sectional view enlarging a vicinity of a rotating cup 30 in liquid processing apparatus 100 according to the exemplary embodiment of the present disclosure. FIG. 3 is a perspective view showing rotating cup 30 in liquid processing apparatus 100 according to the exemplary embodiment of the present disclosure.

As shown in FIG. 1, liquid processing apparatus 100 includes a processing liquid supplying mechanism 10, a discharging mechanism 20, a rotating cup 30, supporting pins 35, a top plate 40, a base plate (base) 50, a rotation driving unit 60 and a control unit 70.

In addition, rotation driving unit 60 corresponds to a rotating unit in the present disclosure. In addition, rotating cup 30 and supporting pin 35 correspond to a support unit in the present disclosure.

Processing liquid supplying mechanism 10 supplies a processing liquid to a bottom surface of wafer W. Discharging mechanism 20 discharges the processing liquid which has been used in processing of wafer W. Rotating cup 30 is installed outside a peripheral portion of wafer W, and guides the processing liquid which has been used in processing of wafer W to discharging mechanism 20.

Processing liquid supplying mechanism 10 includes a first processing liquid supplying unit 11a, a second processing liquid supplying unit 11b, a deionized water supplying unit 11c, a first opening/closing mechanism 11d and a processing liquid supplying pipe 12, as shown in FIG. 1. First processing liquid supplying unit 11a, second processing liquid supplying unit 11b and deionized water supplying unit 11c switchably supply a first processing liquid E1, a second processing liquid E2 and a deionized water DIW, respectively. First opening/closing mechanism 11d, with being switchable between first processing liquid supplying unit 11a, second processing liquid supplying unit 11b and deionized water supplying unit 11c, is connected to processing liquid supplying pipe 12. That is, first opening/closing mechanism 11d is configured to switch between first processing liquid supplying unit 11a, second processing liquid supplying unit 11b and deionized water supplying unit 11c. In addition, first opening/closing mechanism 11d can stop the entire supply of first processing liquid supplying unit 11a, second processing liquid supplying unit 11b and deionized water supplying unit 11c. Processing supplying pipe 12 guides first processing liquid E1, second processing liquid E2 or deionized water DIW switchably supplied from processing liquid supplying unit 11a, second processing liquid supplying unit 11b and deionized water supplying unit 11c up to the bottom surface of wafer W. A processing liquid supplying opening 12a is formed on the top of processing liquid supplying pipe 12.

In this exemplary embodiment, for example, processing liquid supplying mechanism 10 can be configured to supply first processing liquid E1 containing hydrofluoric acid HF by first processing liquid supplying unit 11a, second processing liquid E2 containing ammonia hydrogen peroxide mixture SC1 by second processing liquid supplying unit 11b, and subsequently, deionized water DIW by deionized water supplying unit 11c.

Discharging mechanism 20 includes a drainage cup 21 and a drainage pipe 22, as shown in FIG. 1. Drainage cup 21 receives the processing liquid guided by rotating cup 30. Drainage pipe 22 drains the processing liquid received by drainage cup 21. In addition, an exhaust cup 23 is installed around drainage cup 21, and an exhaust pipe 24 is installed in exhaust cup 23 to discharge gases such as nitrogen gas in exhaust cup 23 by suction. Further, exhaust pipe 24 is connected to a discharge suction unit (not shown) to impart suction.

Figure 2:
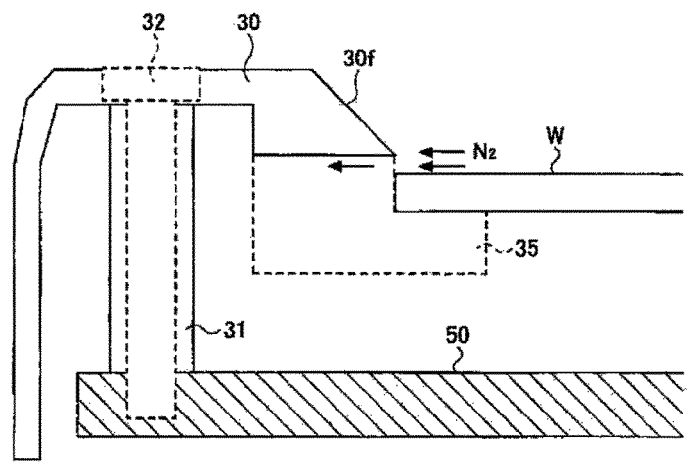
FIG. 2 is a schematic cross sectional view enlarging the vicinity of a rotating cup in the liquid processing apparatus according to the exemplary embodiment of the present disclosure.
Figure 3:
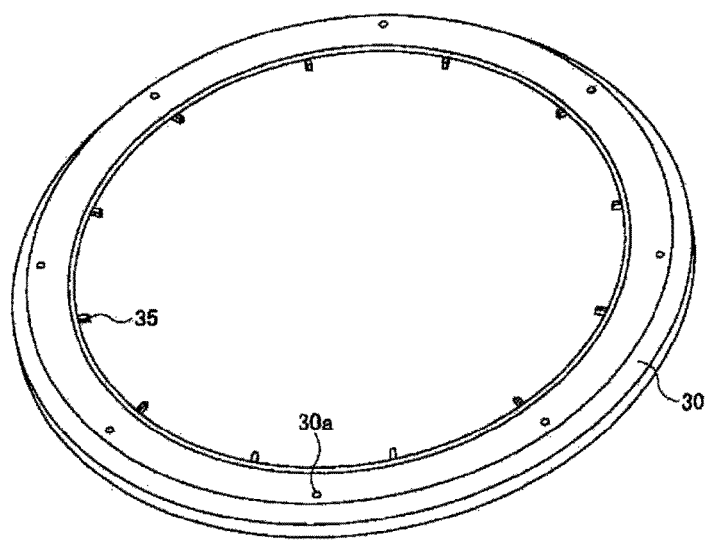
FIG. 3 is a perspective view showing the rotating cup according to the exemplary embodiment of the present disclosure.

A plurality of supporting pins 35 are installed to protrude from the lower end of rotating cup 30 to the inner side of the peripheral portion, as shown in FIGS. 1 to 3. Supporting pins (support unit) 35 support the bottom surface of the peripheral portion of wafer W.

Top plate 40 is installed at the top side of wafer W supported by supporting pins 35 to cover wafer W, as shown in FIG. 1. Inside top plate 40, an inert gas supplying pipe 47 is extended to connect with an inert gas supplying unit 46 which supplies inert gas such as nitrogen gas (in the exemplary embodiment) or argon gas. In addition, inert gas supplying pipe 47 has an edge at the center of top plate 40, and this edge forms an inert gas supplying opening 47a. Further, as shown in FIG. 1, top plate driving unit 49 is connected to top plate 40 to move top plate 40 vertically.

Base plate (base) 50 is installed at a lower side of rotating cup 30 as shown in FIG. 1. Base plate (base) 50 has a hollow shape, and a rotation axis 51 having a hollow configuration is installed thereon, which extends downward.

Rotation driving unit 60 rotates rotation axis 51. Rotation driving unit 60 is connected to rotation axis 51. As rotation axis 51 is rotated by rotation driving unit 60, base plate 50 and rotating cup 30 can be rotated, thereby rotating wafer W on supporting pins 35 installed on rotating cup 30.

Rotation driving unit 60 includes a motor 61, a pulley 62 and a driving belt 63, as shown in FIG. 1. Pulley 62 is arranged outside a peripheral portion of rotation axis 51. Driving belt 63 is hung on pulley 62. Motor 61 imparts driving force to driving belt 63 to rotate rotation 51 via pulley 62. A bearing 52 is arranged outside the peripheral portion of rotation axis 51.

Further, as shown in FIG. 1, in the hollow of rotation axis 51 and rotating cup 30, there are arranged a lift pin plate 55 having a hollow shape, which is equipped with lift pins 55a, and a lift axis 56 having a hollow shape, which extends downward from lift pin plate 55. Further, as shown in FIG. 1, processing liquid supplying pipe 12 extends vertically in the inside (hollow) of lift axis 56 and lift pin plate 55. Further, lift axis driving unit (not shown) is connected to lift axis 56 to move lift axis 56 vertically.

Further, as shown in FIG. 2, a spacer 31 is arranged between base plate 50 and rotating cup 30. A fastening member 32 such as a screw is installed in spacer 31 to fasten rotating 30 and base plate 50. Further, as shown in FIG. 3, rotating cup 30 has holes 30a formed thereon to be stuck through with fastening member 32.

Further, in this exemplary embodiment, supporting pins 35 and rotating cup 30 are configured integrally. Spacer 31 and rotating cup 30 are also configured integrally.

Control unit 70 includes, for example, an operation processing unit, a memory unit and a display unit, which are not shown. The operation processing unit is, for example, a computer having a CPU (Central Processing Unit). The memory unit is a computer readable recording medium which records a program executing various processes in the operation processing unit, and is configured with, for example, a hard disc. The display unit includes, for example, a screen of the computer. The operation processing unit executes a liquid processing method as described below by reading the program recorded in the memory unit.

That is, control unit 70 controls rotation driving unit 60 and first opening/closing mechanism 11d.

Next, the operation of liquid processing apparatus 100 according to the exemplary embodiment of the present disclosure will be described.

First, wafer W taken out from a carrier (not shown) by a carrying robot (not shown), is arranged on lift pins 55a of lift pin plate 55 positioned at a transfer position (upper side position) by a lift axis driving unit (not shown). At this moment, top plate 40 is positioned at a position upper than the transfer position of wafer W by top plate driving unit 49.

Subsequently, by lift axis driving unit (not shown), lift pin plate 55 moves down to be positioned at a wafer processing position (see FIG. 1). While lift pin plate 55 moves downward on this wise, the peripheral portion of wafer W is supported by supporting pins 35 installed on rotating cup 30. Then, by top plate driving unit 49, top plate 40 is positioned at a lower side position.

In addition, in the exemplary embodiment, an inner peripheral surface of rotating cup 30 is inclined downward (see FIG. 2). On this account, wafer W can be slid down to a predetermined position, such that wafer W can be firmly supported by supporting pins 35.

Subsequently, as rotation axis 51 is rotated by rotation driving unit 60, base plate 50 and rotating cup 30 are rotated, thereby rotating wafer W on supporting pins 35 installed on rotating cup 30. Here, rotation axis 51 is rotationally driven by motor 61 imparting driving force via driving belt 63 to pulley 62.

At this moment, first processing liquid E1 (or second processing liquid E2) is supplied to the bottom surface of wafer W by processing liquid supplying mechanism 10 (see FIG. 1). Then, first processing liquid E1 (or second processing liquid E2), which has been supplied to the bottom surface of wafer W, moves towards the outside of the peripheral portion by centrifugal force generated when wafer W is rotated.

Meanwhile, nitrogen ($N_2$) gas is supplied from inert gas supplying opening 47a provided in the center of top plate 40. And, this nitrogen gas passes through the top surface of wafer W and flows to the outer peripheral portion of wafer W.

Figure 4:
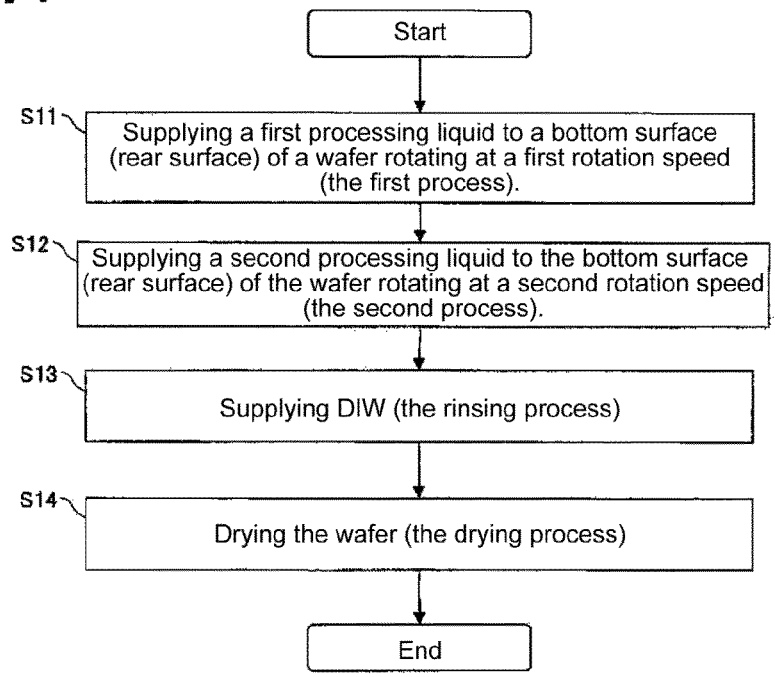
FIG. 4 is a flowchart illustrating the order of the liquid processing method according to the exemplary embodiment of the present disclosure.
Figure 5:
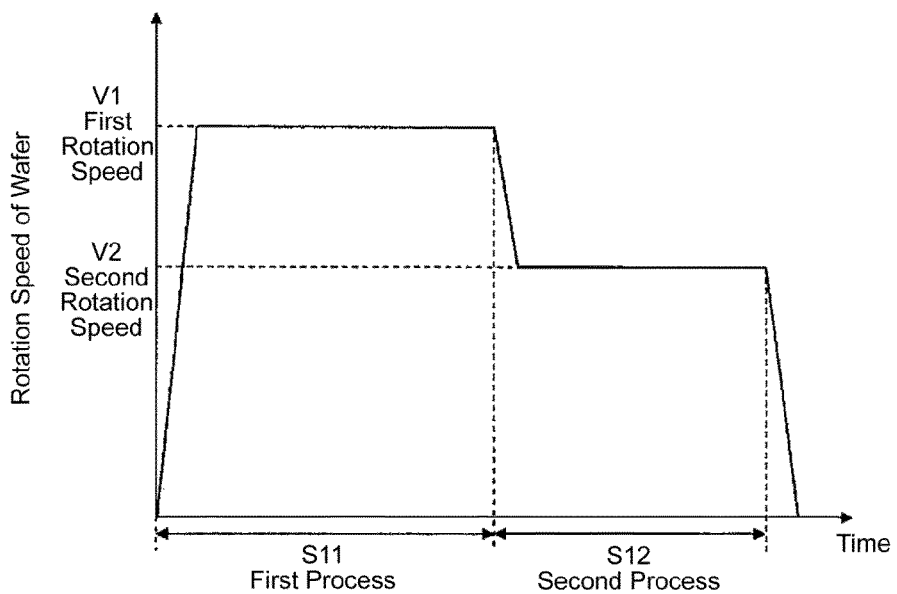
FIG. 5 is a graph showing the change in rotation speed of a wafer over a time period in the liquid processing method according to the exemplary embodiment of the present disclosure.

Next, referring to FIGS. 4 to 6, a liquid processing method will be described, which is carried out using liquid processing apparatus 100 by control unit 70. FIG. 4 is a flowchart illustrating the order of the liquid processing method according to the exemplary embodiment of the present disclosure. FIG. 5 is a graph showing the change in rotation speed of wafer W over a time period in the liquid processing method according to the exemplary embodiment of the present disclosure. FIG. 6 is a cross sectional view schematically showing the state of wafer W in the liquid processing method according to the exemplary embodiment of the present disclosure. Further, FIG. 6 shows only wafer W and processing liquid supplying mechanism 10 for clarity of illustration (similar to FIGS. 8 and 9 as described below).

The liquid processing method according to the exemplary embodiment of the present disclosure includes rotating wafer W formed with a titanium-containing film on its top surface (front surface) TS and bottom surface (rear surface) BS, supplying first processing liquid E1 containing hydrofluoric acid and second processing liquid E2 containing ammonia hydrogen peroxide mixture sequentially to bottom surface (rear surface) BS of wafer W, and removing titanium-containing film TF from bottom surface (rear surface) BS.

Further, the liquid processing method according to the exemplary embodiment of the present disclosure will be described with respect to an example in which wafer W is so supported that the front surface becomes top surface TS, and the rear surface becomes bottom surface BS. However, a liquid processing apparatus may be also configured to supply first processing liquid E1 and second processing liquid E2 to top surface TS of wafer W. In this case, wafer W may be so supported that the rear surface becomes top surface TS, and the front surface becomes bottom surface BS.

The liquid processing method according to the exemplary embodiment of the present disclosure includes a first process (step S11), a second process (step S12), a rinsing process (step S13) and a drying process (step S14), as shown in FIG. 4.

In the first process (step S11), first processing liquid E1 containing hydrofluoric acid is supplied to bottom surface (rear surface) BS of wafer W rotating at a first rotation speed V1.

First, wafer W formed with a titanium-containing film on top surface (front surface) TS and bottom surface (rear surface) BS is taken out from a carrier. And then, wafer W taken out from the carrier is arranged on lift pins 55a of lift pin plate 55. Further, by moving lift plate 55 down to the wafer processing position, the peripheral portion of wafer W is supported by supporting pins 35 which is rotatably installed. Then, by top plate driving unit 49, top plate 40 is moved down to the lower side position.

Figure 6A:
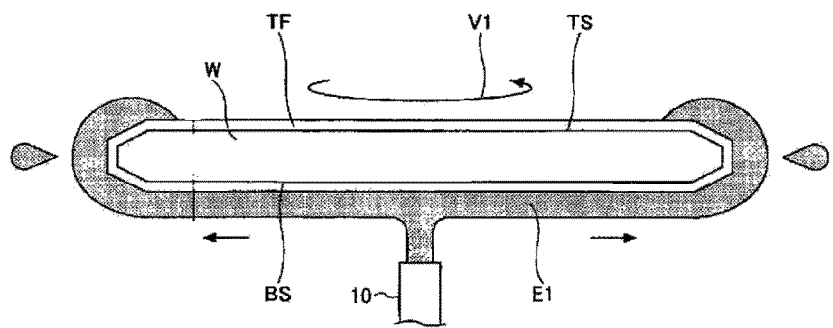
FIG. 6 is a cross sectional view schematically showing the state of the wafer in the liquid processing method according to the exemplary embodiment of the present disclosure.

Subsequently, wafer W supported on supporting pins 35 of rotating cup 30 is rotated along with rotating cup 30 at first rotation speed V1, as shown in FIG. 5. And, in the state of rotating wafer W, first opening/closing mechanism 11d switches so as to supply first processing liquid E1 containing hydrofluoric acid to bottom surface (rear surface) BS of wafer W that is rotating, by first processing liquid supplying unit 11a in processing liquid supplying mechanism 10. FIG. 6(a) shows the state of wafer immediately after the supply of first processing liquid E1 is started.

As shown in FIG. 6(a), first processing liquid E1 supplied to bottom surface (rear surface) BS of wafer W, moves from bottom surface (rear surface) BS of wafer W towards the outside of the peripheral portion by centrifugal force generated when wafer W is rotated. As a result, bottom surface (rear surface) BS of wafer W is processed by first processing liquid E1.

Further, for example, as shown in FIG. 5, first rotation speed V1 can be a relatively high rotation speed.

Further, as shown in FIG. 6(a), a portion of first processing liquid E1 moved from bottom surface (rear surface) BS of wafer W towards the outside of the peripheral portion, may detour from bottom (rear surface) BS of wafer W to top surface (front surface) TS. In this case, first processing liquid E1 is also supplied to the peripheral portion of top surface (front surface) TS of wafer W. Therefore, the peripheral portion of top surface (front surface) TS of wafer W can be also processed with first processing liquid E1.

Figure 6B:
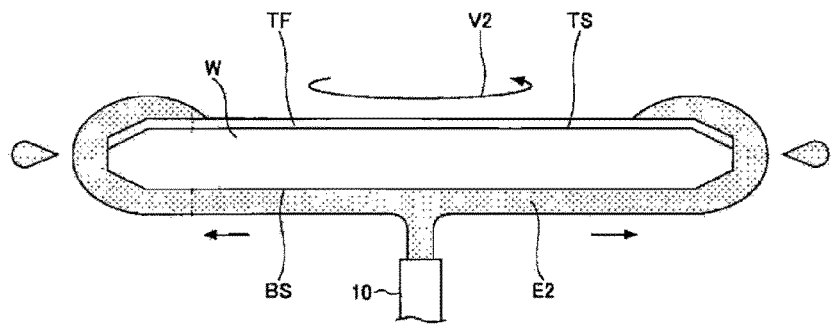

When first processing liquid E1 is supplied continuously, titanium-containing film TF will be removed from bottom surface (rear surface) BS of wafer W, as shown in FIG. 6(b) as described below.

Titanium-containing film TF may be any film containing titanium. For example, titanium oxides ($TiO_x$) may be used. The film thickness of titanium-containing film TF may be, but not particularly limited to, for example, 40 nm.

First rotation speed V1 may be 1000 rpm or more and 2000 rpm or less. If first rotation speed V1 is lower than 1000 rpm, there is concern that first processing liquid E1 detours to the central side, passing through top surface (front surface) TS of wafer W. In addition, if first rotation speed V1 is higher than 2000 rpm, first processing liquid E1 splashes in large amounts when the liquid is in contact with rotation cup 30, and hence, top surface (front surface) TS of wafer W is contaminated with first processing liquid E1.

First processing liquid E1 may be, for example, 50 wt % of aqueous hydrofluoric acid solution.

The supply rate of first processing liquid E1 may be 500 sccm or more and 1500 sccm or less. If the supply rate of first processing liquid E1 is less than 500 rpm, first processing liquid E1 cannot be supplied uniformly to bottom surface (rear surface) BS of wafer W. In addition, if the supply rate of first processing liquid E1 is more than 1500 sccm, first processing liquid E1 splashes in large amounts when the liquid is in contact with rotation cup 30, and hence, top surface (front surface) TS of wafer W is contaminated with first processing liquid E1.

The temperature of first processing liquid E1 may be 60° C. or higher and 80° C. or lower. If the temperature is lower than 60° C., it is not practical due to the decreased etch rate. In addition, if the temperature is higher than 80° C., each member in the liquid processing apparatus should have high heat resistance, thereby increasing the cost.

The processing time of the first process (step S11) may be 2 minutes or more and 10 minutes or less. If the processing time is less than 2 minutes, titanium-containing film TF cannot be removed from bottom surface (rear surface) BS of wafer W. In addition, if the processing time is more than 10 minutes, the total processing time is increased, thereby increasing the cost.

Next, in the second process (step S12), second processing liquid E2 containing ammonia hydrogen peroxide mixture is supplied to bottom surface (rear surface) BS of wafer W rotating at a second rotation speed V2.

The supply of first processing liquid E1 is halted after the first process (step S11), that is, after processing with first processing liquid E1. And, wafer W supported on supporting pins 35 of rotating cup 30 is rotated along with rotating cup 30 at second rotation speed V2, as shown in FIG. 5. And, in the state of rotating wafer W, first opening/closing mechanism 11d switches from first processing liquid supplying unit 11a to second processing liquid supplying unit 11b, and then second processing liquid E2 containing ammonia hydrogen peroxide mixture is supplied to bottom surface (rear surface) BS of wafer W that is rotating, by second processing liquid supplying unit 11b in processing liquid supplying mechanism 10. FIGS. 6(b) and (c) show the states of wafer W immediately after supplying second processing liquid E2, and immediately before halting the supply of second processing liquid E2, respectively.

As shown in FIG. 6(b), after the first process (step S11), titanium-containing film TF has been already removed from bottom surface (rear surface) BS of wafer W. And, as shown in FIG. 6(b), second processing liquid E2 supplied to bottom surface (rear surface) BS of wafer W, moves from bottom surface (rear surface) BS of wafer W towards the outside of the peripheral portion by centrifugal force generated when wafer W is rotated. As a result, bottom surface (rear surface) BS of wafer W is processed by second processing liquid E2.

Further, as shown in FIG. 6(b), a portion of second processing liquid E2 moved from bottom surface (rear surface) BS of wafer W towards the outside of the peripheral portion, detours from bottom (rear surface) BS of wafer W to top surface (front surface) TS. As a result, second processing liquid E2 is also supplied to the peripheral portion of top surface (front surface) TS of wafer W. Therefore, the peripheral portion of top surface (front surface) TS of wafer W is also processed with second processing liquid E2.

Further, by controlling second rotation speed V2 and the flow rate of nitrogen gas, it is possible to control the amount of second processing liquid E2 detoured to the peripheral portion of top surface (front surface) TS of wafer W. For example, as shown in FIG. 5, second rotation speed V2 can be relatively lower than first rotation speed V2. By setting second rotation speed V2 lower than first rotation speed V1, it is possible to make the amount of second processing liquid E2 detoured to top surface (rear surface) TS of wafer W in the second process (step S12) more than the amount of first processing liquid E1 detoured to top surface (front surface) TS of wafer W in the first process (step S11).

Further, according to a modified embodiment of the present disclosure, a third processing liquid may be supplied to a peripheral portion (bevel) of wafer W by a second processing liquid supplying mechanism.

Figure 6C:
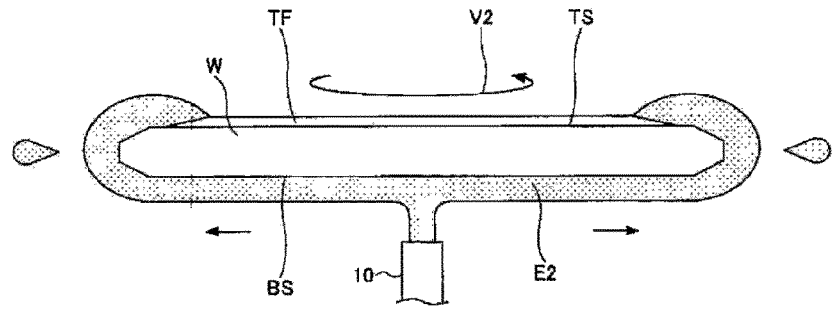

Then, when second processing liquid E2 is supplied continuously, titanium-containing film TF will be removed from the lateral surface and the peripheral portion of top surface (front surface) TS of wafer W, as shown in FIG. 6(c). Further, titanium elements are removed, which remains on bottom surface (rear surface) BS of wafer W from which titanium-containing film TF has been removed in the first process (step S11).

In the exemplary embodiment of the present disclosure, first processing liquid E1 containing hydrofluoric acid with high etch rate is supplied in the first process (step S11), and second processing liquid E2 containing ammonia hydrogen peroxide mixture with low etch rate is supplied in the second process (step S12). On this account, it is possible to remove titanium-containing film TF from bottom surface (rear surface) BS in a shorter time.

Further, in the exemplary embodiment of the present disclosure, it is possible to make the amount of first processing liquid E1 detoured to top surface (rear surface) TS of wafer W in the first process (step S11) less than the amount of second processing liquid E2 detoured to top surface (front surface) TS of wafer W in the second process (S12). On this account, flake-type peeling is not occurred due to titanium-containing film TF weakened near the boundary between the portion at which titanium-containing film TF is removed (peripheral portion) and the portion at which titanium-containing film TF is not removed (central portion) in top surface (front surface) TS. Therefore, in the second process (step S12), titanium-containing film TF can be etched such that the film thickness of titanium-containing film TF is decreased constantly from the portion at which titanium-containing film TF is not removed (central portion) to the portion at which titanium-containing film TF is removed (peripheral portion) in top surface (front surface) TS.

Second rotation speed V2 may be 800 rpm or more and 1400 rpm or less. If second rotation speed V2 is lower than 800 rpm, second processing liquid E2 cannot be supplied uniformly to bottom surface (rear surface) BS of wafer W. In addition, if second rotation speed V2 is higher than 1400 rpm, second processing liquid E2 does not detour sufficiently to top surface (front surface) TS of wafer W.

Second processing liquid E2 may include ammonia hydrogen peroxide mixture SC1 including ammonia water ($NH_4OH$) and oxygenated water ($H_2O_2$). That is, second processing liquid E2 contains ammonia and hydrogen peroxide.

In terms of the concentrations of ammonia and hydrogen peroxide in second processing liquid E2, the concentration of ammonia may be 3 wt % or more, and the concentration of hydrogen peroxide may be 30 wt % or more. If the concentration of ammonia is less than 3 wt %, or the concentration of hydrogen peroxide is less than 30 wt %, the etch rate to etch titanium-containing film TF will be lowered.

The supply rate of second processing liquid E2 may be 500 sccm or more and 1500 sccm or less. If the supply rate of second processing liquid E2 is less than 500 rpm, second processing liquid E2 cannot be supplied uniformly to bottom surface (rear surface) BS of wafer W. In addition, if the supply rate of second processing liquid E2 is more than 1500 sccm, second processing liquid E2 splashes in large amounts when the liquid is in contact with rotation cup 30, and hence, top surface (front surface) TS of wafer W is contaminated with second processing liquid E2.

The temperature of second processing liquid E2 may be 60° C. or higher and 80° C. or lower. If the temperature is lower than 60° C., it is not practical due to the decreased etch rate. In addition, if the temperature is higher than 80° C., each member in the liquid processing apparatus should have high heat resistance, thereby increasing the cost.

The processing time of the second process (step S12) may be 1 minute or more and 10 minutes or less. If the processing time is less than 1 minute, titanium elements cannot be removed completely, which remain on bottom surface (rear surface) BS of wafer W from which titanium-containing film TF has been removed. In addition, if the processing time is more than 10 minutes, the total processing time is increased, thereby increasing the cost.

After the second process (step S12), deionized water DIW is supplied to bottom surface (rear surface) BS of wafer W which is rotating, in the rinsing process (step S13).

In the state of rotating wafer W supported on supporting pins 35 of rotating cup 30 along with rotating cup 30, first opening/closing mechanism 11d switches so as to halt the supply of second processing liquid E2 by second processing liquid supplying unit 11b, and start the supply of deionized water DIW by deionized water supplying unit 11c. Then, deionized water DIW is supplied to bottom surface (rear surface) BS of wafer W which is rotating, by deionized water supplying unit 11c.

After the rinsing process (step S13), wafer is dried in the drying process (step S14).

In the state of rotating wafer W supported on supporting pins 35 of rotating cup 30 along with rotating cup 30, first opening/closing mechanism 11d switches so as to halt the supply of deionized water DIW by deionized water supplying unit 11c. As a result, deionized water DIW remaining on bottom surface (rear surface) BS of wafer W is dusted off to the outside of the peripheral portion by centrifugal force, and hence, wafer W is spin-dried.

After the drying process (step S14), rotating cup 30 stops rotating, and therefore, wafer W supported on supporting pins 35 stops rotating as well, thereby completing the liquid processing.

Next, it will be described that the liquid processing method according to the exemplary embodiment of the present disclosure can remove titanium elements remaining on bottom surface (rear surface) BS of wafer W in a shorter time, and prevents flake-type peeling in top surface (front surface) TS of wafer W, compared with Comparative Examples 1 and 2.

FIG. 7 is a cross sectional view schematically showing the state of wafer W in the liquid processing method according to Comparative Example 1.

The liquid processing method according to Comparative Example 1 includes rotating wafer W formed with a titanium-containing film on its top surface (front surface) TS and bottom surface (rear surface) BS, supplying only first processing liquid E1 containing hydrofluoric acid to bottom surface (rear surface) BS of wafer W, and removing titanium-containing film TF from bottom surface (rear surface) BS. That is, this is similar to the liquid processing method according to the exemplary embodiment of the present disclosure, except that the second process (step S12) in the exemplary embodiment of the present disclosure is not included.

Figure 7A:
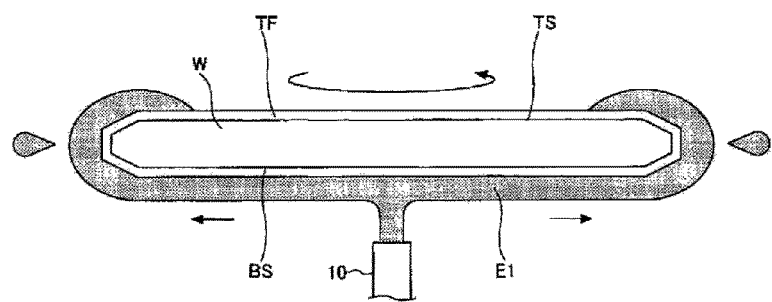
FIG. 7 is a cross sectional view schematically showing the state of the wafer in the liquid processing method according to Comparative Example 1.

Wafer W supported on supporting pins 35 and formed with a titanium-containing film on its top surface (front surface) TS and bottom surface (rear surface) BS, is rotated along with rotating cup 30, and first processing liquid E1 containing hydrofluoric acid is supplied to bottom surface (rear surface) BS of wafer W by processing liquid supplying mechanism 10. FIGS. 7(a) and (b) show the states of wafer W immediately after starting the supply of first processing liquid E1, and immediately before halting the supply of first processing liquid E1, respectively.

As shown in FIG. 7(a), first processing liquid E1 supplied to bottom surface (rear surface) BS of wafer W, moves from bottom surface (rear surface) BS of wafer W towards the outside of the peripheral portion by centrifugal force generated when wafer W is rotated. Further, as shown in FIG. 7(a), a portion of first processing liquid E1 moved from bottom surface (rear surface) BS of wafer W towards the outside of the peripheral portion, detours from bottom (rear surface) BS of wafer W to top surface (front surface) TS. As a result, first processing liquid E1 is also supplied to the peripheral portion of top surface (front surface) TS of wafer W. Therefore, the peripheral portion of top surface (front surface) TS of wafer W is also processed with first processing liquid E1.

Figure 7B:
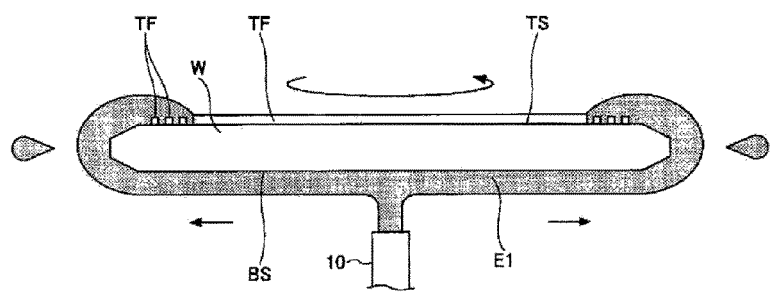

Then, when first processing liquid E1 is supplied continuously, titanium-containing film TF will be removed from bottom surface (rear surface) BS of wafer W, as shown in FIG. 7(b). In addition, titanium-containing film TF is also removed from the lateral portion of wafer W. And, titanium-containing film TF is removed from the peripheral portion of top surface (front surface) TS of wafer W as well.

FIG. 8 is a cross sectional view schematically showing the state of wafer W in the liquid processing method according to Comparative Example 2.

The liquid processing method according to Comparative Example 2 includes rotating wafer W formed with a titanium-containing film on its top surface (front surface) TS and bottom surface (rear surface) BS, supplying only second processing liquid E2 containing ammonia hydrogen peroxide mixture to bottom surface (rear surface) BS of wafer W, and removing titanium-containing film TF from bottom surface (rear surface) BS. That is, this is similar to the liquid processing method according to the exemplary embodiment of the present disclosure, except that the first process (step S11) in the exemplary embodiment of the present disclosure is not included.

Figure 8A:
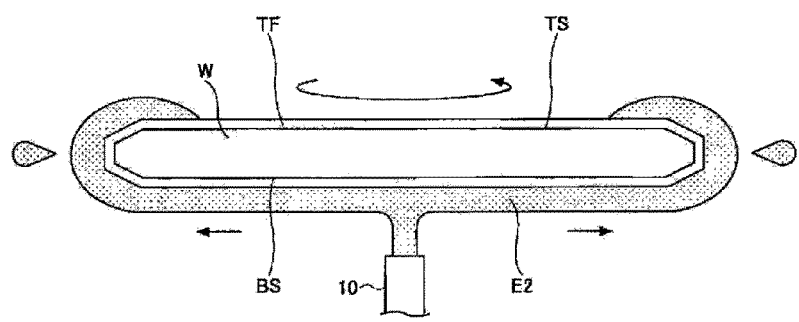
FIG. 8 is a cross sectional view schematically showing the state of the wafer in the liquid processing method according to Comparative Example 2.

Wafer W supported on supporting pins 35 and formed with a titanium-containing film on its top surface (front surface) TS and bottom surface (rear surface) BS, is rotated along with rotating cup 30, and second processing liquid E2 containing ammonia hydrogen peroxide is supplied to bottom surface (rear surface) BS of wafer W by processing liquid supplying mechanism 10. FIGS. 8(a) and (b) show the states of wafer W immediately after starting the supply of second processing liquid E2, and immediately before halting the supply of second processing liquid E2, respectively.

As shown in FIG. 8(a), second processing liquid E2 supplied to bottom surface (rear surface) BS of wafer W, moves from bottom surface (rear surface) BS of wafer W towards the outside of the peripheral portion by centrifugal force generated when wafer W is rotated. Further, as shown in FIG. 8(a), a portion of second processing liquid E2 moved from bottom surface (rear surface) BS of wafer W towards the outside of the peripheral portion, detours from bottom (rear surface) BS of wafer W to top surface (front surface) TS. As a result, second processing liquid E2 is also supplied to the peripheral portion of top surface (front surface) TS of wafer W. Therefore, the peripheral portion of top surface (front surface) TS of wafer W is also processed with second processing liquid E2.

Figure 8B:
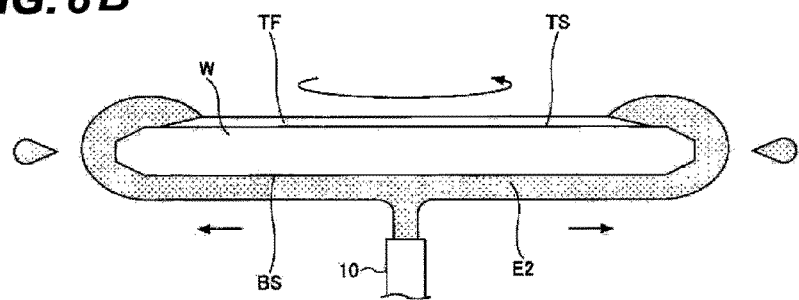

Then, when second processing liquid E2 is supplied continuously, titanium-containing film TF will be removed from bottom surface (rear surface) BS of wafer W, as shown in FIG. 8(b). In addition, titanium-containing film TF is also removed from the lateral portion of wafer W. And, titanium-containing film TF is removed from the peripheral portion of top surface (front surface) TS of wafer W as well.

Figure 9A:
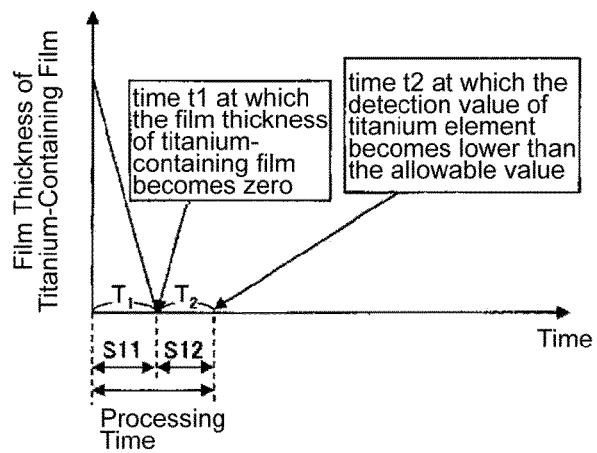
FIG. 9 is a graph schematically showing the change in film thickness of titanium-containing films over a time period by comparing the exemplary embodiment of the present disclosure and Comparative Examples.

FIG. 9 is a graph schematically showing the change in film thickness of titanium-containing film TF over a time period by comparing the exemplary embodiment of the present disclosure and Comparative Examples. FIGS. 9(a), (b) and (c) show the change in film thickness over a time period in the exemplary embodiment of the present disclosure, Comparative Example 1 and Comparative Example 2, respectively.

The film thickness of titanium-containing film can be measured by, for example, X-ray reflectometry.

Figure 9B:
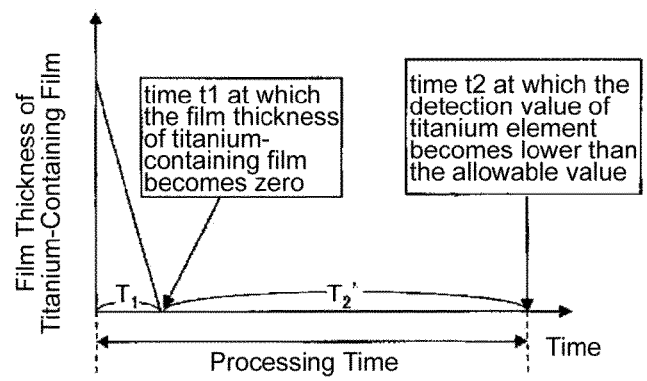

Since Comparative Example 1 uses first processing liquid E1 containing hydrofluoric acid as in the exemplary embodiment of the present disclosure, time t1 at which the film thickness of titanium-containing film TF becomes zero after starting the process is substantially the same between Comparative Example 1 as shown in FIG. 9(b) and the exemplary embodiment of the present disclosure as shown in FIG. 9(a). That is, processing time $T_1$ for which the film thickness of titanium-containing film TF becomes zero after starting the process is substantially the same between Comparative Example 1 as shown in FIG. 9(b) and the exemplary embodiment of the present disclosure as shown in FIG. 9(a).

However, as described below by referring to FIG. 11, in the case of using only first processing liquid E1 containing hydrofluoric acid, an additional long-time processing is needed in order to reduce the detection value of titanium elements to the allowable value or less after the film thickness of the titanium-containing film on bottom surface (rear surface) BS of wafer W becomes approximately zero. Although it depends on the conditions, there is a case that the time from time t1 to time t2 (processing time $T_2'$ in FIG. 9(b)) reaches several hundred % relative to the time to time t1 after starting the process (processing time $T_1$ in FIG. 9(a)).

Meanwhile, in the case of using first processing liquid E1 containing hydrofluoric acid in the first half to make the film thickness of the titanium-containing film on bottom surface (rear surface) BS of wafer W approximately zero, and then, using second processing liquid E2 containing ammonia hydrogen peroxide mixture in the second half, a long-time processing is not needed in order to reduce the detected amount of titanium elements to the allowable amount or less. Although it depends on the conditions, there is a case that the time from time t1 to time t2 (processing time $T_2$ in FIG. 9(b)) is sufficiently 10% relative to the time to time t1 after starting the process (processing time $T_1$ in FIG. 9(a)).

Accordingly, time t2 at which the detection value of titanium elements becomes lower than the allowable value in the exemplary embodiment of the present disclosure as shown in FIG. 9(a), is faster than in Comparative Example 1 as shown in FIG. 9(b). Therefore, according to the exemplary embodiment of the present disclosure, titanium elements remaining on bottom surface (rear surface) BS of wafer W can be removed in a shorter time.

Figure 9C:
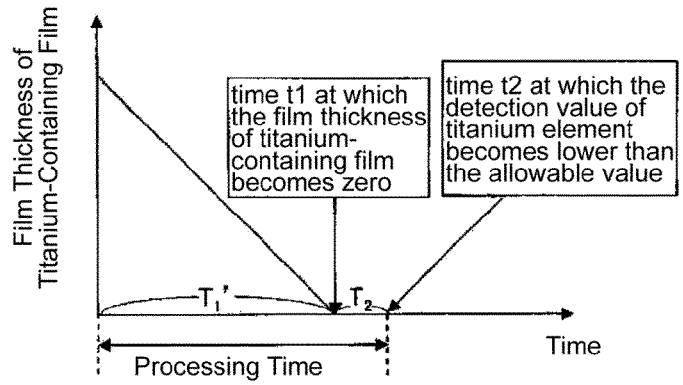

In contrast, in Comparative Example 2, since only second processing liquid E2 containing ammonia hydrogen peroxide mixture is used, the etch rate is lower than in the case in which first processing liquid E1 containing hydrofluoric acid is used in the first half. Accordingly, after starting the process, time t1 at which the film thickness of titanium-containing film becomes zero in the exemplary embodiment of the present disclosure as shown in FIG. 9(a), is faster than in Comparative Example 2 as shown in FIG. 9(c). That is, after starting the process, the processing time $T_1$ for which the film thickness of titanium-containing film becomes zero in the exemplary embodiment of the present disclosure as shown in FIG. 9(a), is shorter than the processing time $T_1'$ in Comparative Example 2 as shown in FIG. 9(c).

Further, after the film thickness becomes approximately zero on bottom surface (rear surface) BS of wafer W, the additional processing time in order to reduce the detection value of titanium elements to the allowable value or less, is substantially the same between Comparative Example 2 (processing time $T_2$ as shown in FIG. 9(c)) and the exemplary embodiment of the present disclosure (processing time $T_2$ as shown in FIG. 9(a)) because second processing liquid E2 is used in both of the embodiments.

Accordingly, time t2 at which the detection value of titanium elements becomes lower than the allowable value in the exemplary embodiment of the present disclosure as shown in FIG. 9(a), is faster than in Comparative Example 2 as shown in FIG. 9(c).

From above, according to the exemplary embodiment of the present disclosure, titanium elements remaining on bottom surface (rear surface) BS of wafer W can be removed in a shorter time than in Comparative Examples 1 and 2.

Next, after performing the liquid processing methods according to the exemplary embodiment of the present disclosure and Comparative Example 1, top surface (front surface) TS of wafer near the boundary between the portion at which titanium-containing film TF is removed (the peripheral portion) and the portion at which titanium-containing film TF is not removed (the central portion), was observed by Scanning Electron Microscope (SEM). The results in the exemplary embodiment and Comparative Example 1 are shown in FIGS. 10(a) and (b), respectively. FIG. 10 is a diagram comparing the photograph of the surface of wafer W after liquid processing method according to the exemplary embodiment of the present disclosure with the photograph of the surface of wafer W after liquid processing method according to Comparative Example 1.

As shown in FIG. 10(a), it is understood that, in the liquid processing method according to the exemplary embodiment of the present disclosure, top surface (front surface) TS near the boundary between the peripheral portion and the central portion, is approximately flat, which is improved as compared with a flake type. As shown in FIG. 10(a), it is understood that, in the liquid processing method according to Comparative Example 1, a minute convex and concave profile is observed on top surface (front surface) TS near the boundary between the peripheral portion and the central portion, and titanium-containing film is peeled at a plurality of positions.

That is, according to Comparative Example 1 using only first processing liquid E1 containing hydrofluoric acid, titanium-containing film TF is peeled in flake type on top surface (front surface) TS of wafer W. That is, according to Comparative Example 1 using only first processing liquid E1 containing hydrofluoric acid, titanium-containing film TF is peeled in flake type on top surface (front surface) TS of wafer W.

Likewise, it can be described, for example, referring to FIG. 11, that titanium elements remaining on bottom surface (rear surface) BS of wafer W can be removed in a shorter time, and flake-type peeling in top surface (front surface) TS of wafer W can be prevented. FIG. 11 is a diagram comparing the feature how titanium-containing film TF is etched in the liquid processing method according to the exemplary embodiment of the present disclosure and the feature how titanium-containing film TF is etched in the liquid processing method according to Comparative Example 1.

Figure 11A:
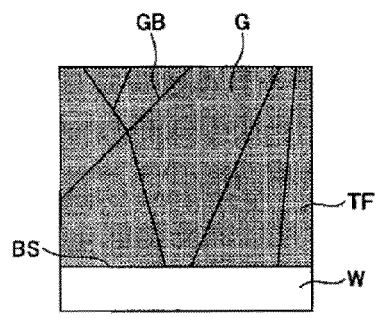
FIG. 11 is a diagram comparing the feature how the titanium-containing film is etched in the liquid processing method according to the exemplary embodiment of the present disclosure and the feature how the titanium-containing film is etched in the liquid processing method according to Comparative Example 1.

FIGS. 11(a), (b) and (c) shows the state of bottom surface (rear surface) BS of wafer W immediately after starting the supply of first processing liquid E1, during the supply, and immediately before halting the supply of first processing liquid E1, respectively, in the first process (step S11) of the liquid processing method according to the exemplary embodiment of the present disclosure. Further, FIG. 11(d) shows the state of bottom surface (rear surface) BS of wafer W after the second process (step S12) of the liquid processing method according to the exemplary embodiment of the present disclosure.

Figure 11E:
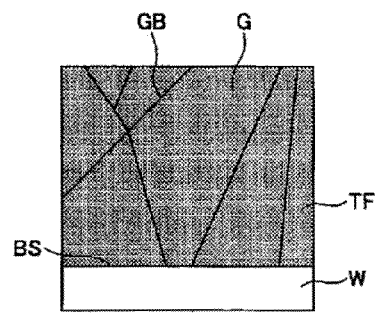

Meanwhile, FIGS. 11(e), (f) and (g) show the state of bottom surface (rear surface) BS of wafer W immediately after starting the supply of first processing liquid E1, during the supply, and immediately before halting the supply of first processing liquid E1, respectively, in the first process (step S11) of the liquid processing method according to Comparative Example 1.

For example, as shown in FIGS. 11(a) and (e), it is understood that there are grains (G) and grain boundaries (GB), or grainized portions (G) and ungrainized portions (GB) in titan-containing film TF. And, when first processing liquid E1 containing hydrofluoric acid is used, it is understood that the etch rates are different between grains (G) and grain boundaries (GB), or grainized portions (G) and ungrainized portions (GB). Therefore, in the liquid processing method according to Comparative Example 1, as first processing liquid E1 is supplied, the portion having high etch rate, such as for example, grain boundaries (GB) or ungrained portions (GB) are removed first, as shown in, for example, FIG. 11(f). And, since titan-containing film TF is not etched constantly through its entire surface, even in the case that the film thickness was zero as measured by film thickness measurement, there exists grains (G) or grainized portions (G) having low etch rate remains. On this account, it appears that the detection value of titanium elements detected by elementary analysis becomes higher than the allowable value.

Figure 11B:
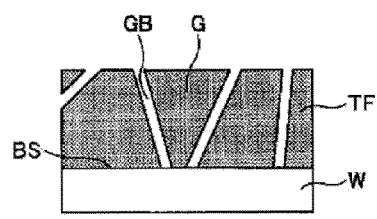
Figure 11F:
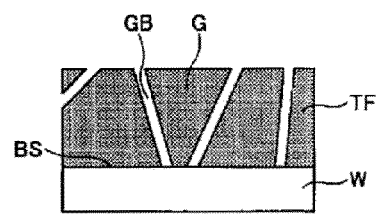
Figure 11C:
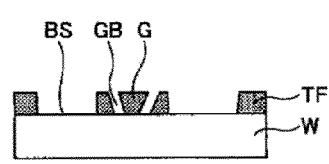
Figure 11G:
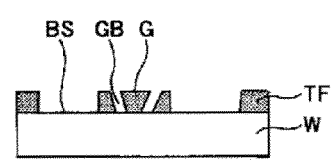
Figure 11D:
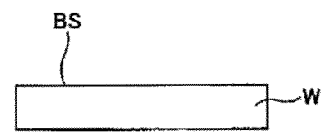

In the exemplary embodiment of the present disclosure, when first processing liquid E1 containing hydrofluoric acid is used in the first process (step S11), it is also understood that the etch rates are different between grains (G) and grain boundaries (GB), or grainized portions (G) and ungrainized portions (GB). Therefore, in the liquid processing method according to the exemplary embodiment of present disclosure, as first processing liquid E1 is supplied, the portion having high etch rate, such as for example, grain boundaries (GB) or ungrained portions (GB) are removed first, for example, as shown in FIG. 11(b). And, since the portion having high etch rate, such as for example, grain boundaries (GB) or ungrainized portions (GB) are removed first, grains (G) is removed as if they are peeled, as shown in FIG. 11(c). Accordingly, the time required to remove titanium-containing film TF is short.

Meanwhile, in the exemplary embodiment of the present disclosure, when second processing liquid E2 containing ammonia hydrogen peroxide mixture is used in the second process (step S12), it is understood that the etch rates are substantially the same between grains (G) and grain boundaries (GB), or grainized portions (G) and ungrainized portions (GB). Therefore, as shown in FIG. 11(d), grains (G) or grainized portions (G) are completely etched through entire bottom surface (rear surface) BS. On this account, it appears that the detection value of titanium elements detected by elementary analysis becomes lower than the allowable value.

Modified Embodiment

Next, with reference to FIG. 12, the liquid processing apparatus according to the modified embodiment of the disclosure will be described. The liquid processing apparatus according to the modified embodiment of the present disclosure is different from the liquid processing apparatus according to the exemplary embodiment of the present disclosure, in that the processing liquid is supplied even to the peripheral portion of wafer W. That is, the liquid processing apparatus according to the modified embodiment of the present disclosure, processes the peripheral portions on bottom surface and top surface of wafer W by supplying a processing liquid to the peripheral portions on bottom surface and top surface of wafer W.

Figure 12:
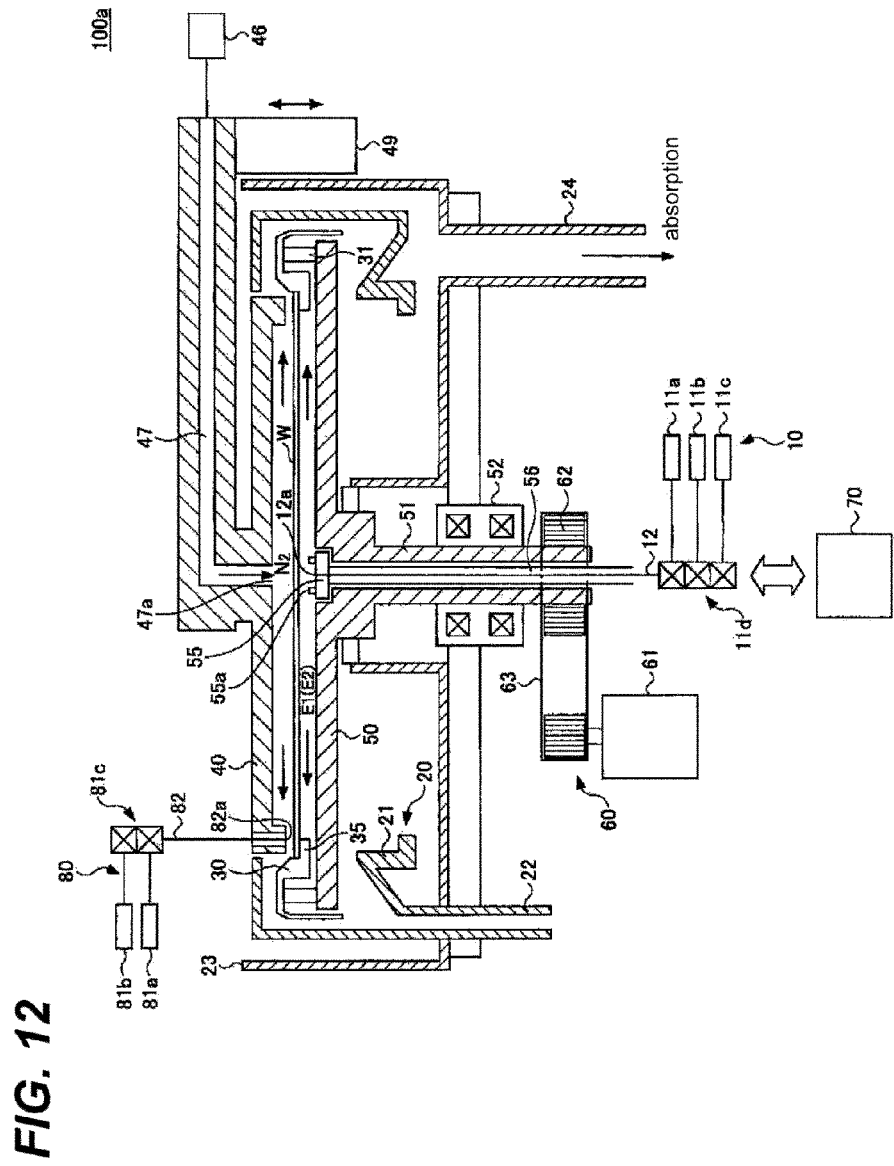
FIG. 12 is a schematic cross sectional view showing the configuration of a liquid processing apparatus according to a modified embodiment of the present disclosure.

FIG. 12 is a schematic cross sectional view showing the configuration of a liquid processing apparatus 100a according to the modified embodiment of the present disclosure.

As shown in FIG. 12, liquid processing apparatus 100a includes processing liquid supplying mechanism 10, discharging mechanism 20, rotating cup 30, supporting pins 35, top plate 40, base plate (base) 50, rotation driving unit 60 and control unit 70. the portions other than a second processing liquid supplying mechanism are similar to those in the liquid processing apparatus according to the exemplary embodiment of the present disclosure as shown in FIG. 1, and have the same reference numerals. Thus, the descriptions thereof will be omitted.

As shown in FIG. 12, second processing mechanism 80 includes a third processing liquid supplying unit 81a, a second deionized water supplying unit 81b, a second opening/closing mechanism 81c and a second processing liquid supplying pipe 82. Third processing liquid supplying unit 81a supplies a third processing liquid E3, and second processing liquid unit 81b supplies deionized water DIW. Second opening/closing mechanism 81c, with being switchable between third processing liquid supplying unit 81a and second deionized water supplying unit 81b, is connected to second processing liquid supplying pipe 82. That is, second opening/closing mechanism 81c is configured to switch between third processing liquid supplying unit 81a and second deionized water supplying unit 81b, and switch the supply of third processing liquid E3 from third processing liquid supplying unit 81a. Second processing liquid supplying pipe 82 guides third processing liquid E3 which is switchably supplied from third processing liquid supplying unit 81a and deionized water DIW which is switchably supplied from second deionized water supplying unit 81b, to the peripheral portion of wafer W. The bottom of second processing liquid supplying pipe 82 forms a second processing liquid supplying opening 82a.

In the modified embodiment of the present disclosure, similar to processing liquid supplying mechanism 10, second processing liquid supplying mechanism 80 can be configured to, for example, first supply third processing liquid E3 containing ammonia hydrogen peroxide mixture SC1 by third processing liquid supplying unit 81a, and subsequently, supply deionized water DIW by second deionized water supplying unit 81b.

Further, in the modified embodiment of the present disclosure, control unit 70 controls rotation driving unit 60, first opening/closing mechanism 11d and second opening/closing mechanism 81c.

The operation of liquid processing apparatus 100a according to the modified embodiment of the present disclosure is substantially similar to the operation of the liquid processing apparatus 100 according to the exemplary embodiment of the present disclosure. However, liquid processing apparatus 100a according to the modified embodiment of the present disclosure includes second processing liquid supplying mechanism 80. Therefore, by second processing liquid supplying mechanism 80, the processing liquid is supplied to the peripheral portion of the top surface of wafer W that is rotation driven.

Figure 13:
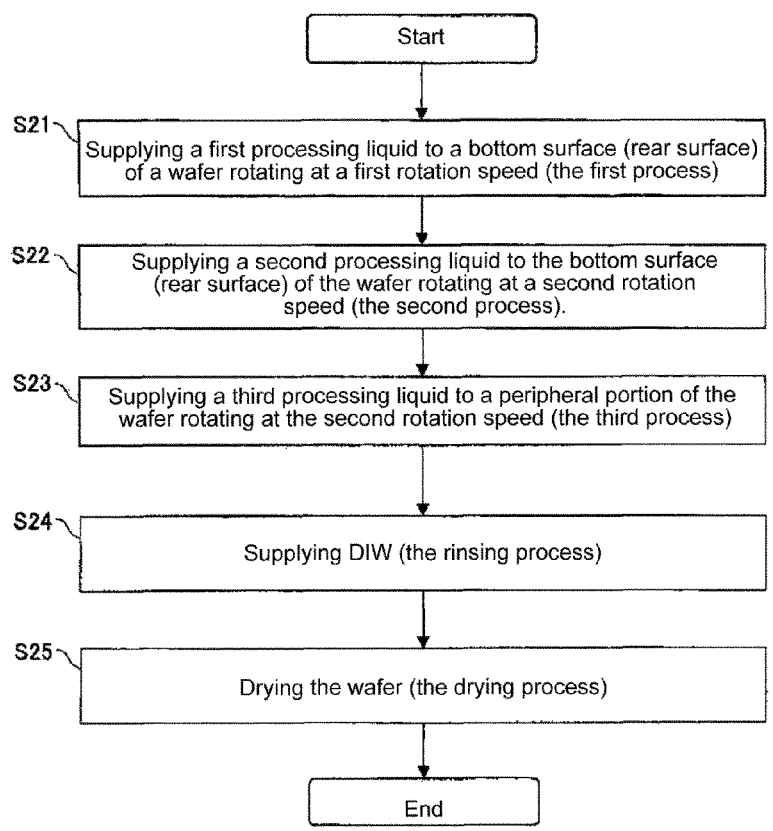
FIG. 13 is a flowchart illustrating the order of the liquid processing method according to the modified embodiment of the present disclosure.

Next, referring to FIGS. 13 and 14, a liquid processing method will be described, which is carried out by control unit 70 using liquid processing apparatus 100a. FIG. 13 is a flowchart illustrating the order of the liquid processing method according to the modified embodiment of the present disclosure. FIG. 14 is a cross sectional view schematically showing the state of wafer W in the liquid processing method according to the modified embodiment of the present disclosure.

Further, FIG. 14 shows only wafer W, processing liquid supplying mechanism 10 and second processing liquid supplying mechanism 80 for the convenience of illustration.

The liquid processing method according to the modified embodiment of the present disclosure includes rotating wafer W formed with a titanium-containing film on its top surface (front surface) TS and bottom surface (rear surface) BS, supplying first processing liquid E1 containing hydrofluoric acid and second processing liquid E2 containing ammonia hydrogen peroxide mixture sequentially to the rear surface of wafer W, and removing titanium-containing film TF from bottom surface (rear surface) BS. Here, when second processing liquid E2 containing ammonia hydrogen peroxide mixture is supplied to bottom surface (rear surface) BS of wafer W that is rotating, third processing liquid E3 containing ammonia hydrogen peroxide mixture is supplied to top surface (front surface) TS of wafer W that is rotating.

Further, the liquid processing method according to the modified embodiment of the present disclosure will be described with respect to an example in which wafer W is so supported that the front surface becomes top surface TS, and the rear surface becomes bottom surface BS. However, a liquid processing apparatus may be also used, which is configured to supply first processing liquid E1 and second processing liquid E2 to top surface TS of wafer W. In this case, wafer W may be so supported that the rear surface becomes top surface TS, and the front surface becomes bottom surface BS.

The liquid processing method according to the modified embodiment of the present disclosure includes a first process (step S21), a second process (step S22), a third process (step S23), a rinsing process (step S24) and a drying process (step S25), as shown in FIG. 13.

In the first process (step S21), first processing liquid E1 containing hydrofluoric acid is supplied to bottom surface (rear surface) BS of wafer W rotating at a first rotation speed V1. First process (step S21) can be carried out in a similar manner to first process (step S11) according to the exemplary embodiment of the present disclosure.

Figure 14A:
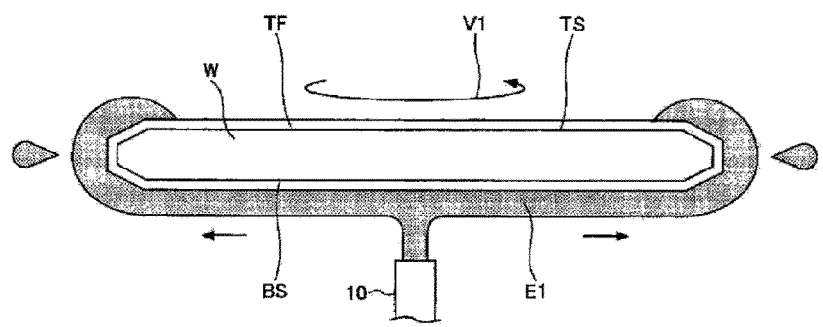
FIG. 14 is a cross sectional view schematically showing the state of the wafer in the liquid processing method according to the modified embodiment of the present disclosure.

Further, FIG. 14(a) shows the state of wafer immediately after the supply of first processing liquid E1 is started.

Next, after first process (step S21), that is, after processing with first processing liquid E1, in the second process (step S22), second processing liquid E2 containing ammonia hydrogen peroxide mixture is supplied to bottom surface (rear surface) BS of wafer W rotating at a second rotation speed V2. Second process (step S22) can be carried out in a similar manner to second process (step S12) according to the exemplary embodiment of the present disclosure.

However, in the modified embodiment of the present disclosure, third processing liquid E3 is supplied to the peripheral portion of wafer W by third process (step S23). On this account, in second process (step S22), a portion of second processing liquid E2 which has been supplied may not detour from bottom surface (rear surface) BS to top surface (front surface) TS of wafer W.

In third process (step S23), third processing liquid E3 containing ammonia hydrogen peroxide mixture is supplied to top surface (front surface) TS of wafer W which is rotating. In the state of rotating wafer W, second opening/closing mechanism 11d switches so as to supply third processing liquid E3 containing ammonia hydrogen peroxide mixture to the peripheral portion of top surface (front surface) TS of wafer W that is rotating, by third processing liquid supplying unit 81a in second processing liquid supplying mechanism 80. Third process (step S23) can be carried out simultaneously with second process (S22), or not. Here, an example will be described, in which third process (step S23) is carried out simultaneously with second process (step S22).

Figure 14B:
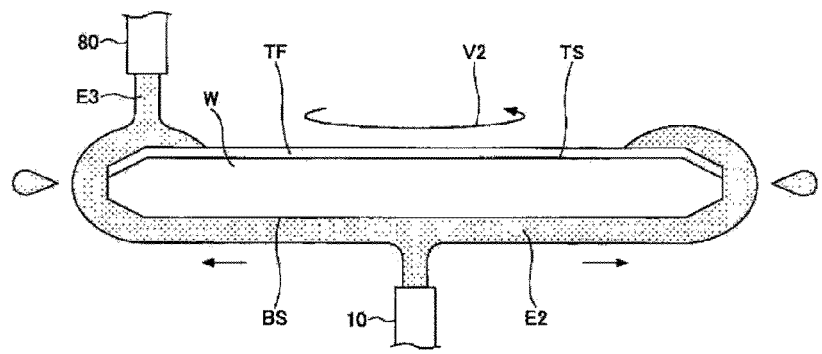

FIGS. 14(b) and (c) show the states of wafer W immediately after starting the supply of second processing liquid E2 and third processing liquid E3, and immediately before halting the supply of second processing liquid E2 and third processing liquid E3, respectively.

As shown in FIG. 14(b), second processing liquid E2 supplied to bottom surface (rear surface) BS of wafer W, moves from bottom surface (rear surface) BS of wafer W towards the outside of the peripheral portion by centrifugal force generated when wafer W is rotated. Further, as shown in FIG. 14(b), third processing liquid E3 supplied to the peripheral portion of top surface (front surface) TS of wafer W, moves from top surface (front surface) TS of wafer W towards the outside of the peripheral portion by centrifugal force generated when wafer W is rotated. As a result, bottom surface (rear surface) BS, the lateral surface and top surface (front surface) TS of wafer W are processed by second processing liquid E2 and third processing liquid E3.

Figure 14C:
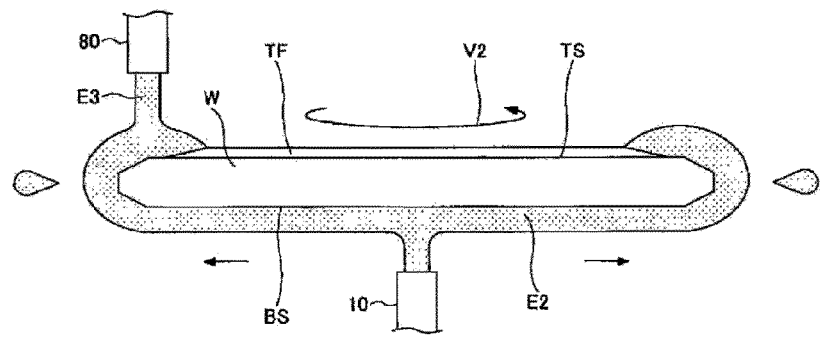

Then, when second processing liquid E2 and third processing liquid are supplied continuously, titanium-containing film TF will be removed from the lateral surface and the peripheral portion of top surface (front surface) TS of wafer W, as shown in FIG. 14(c). Further, titanium elements are removed, which remains on bottom surface (rear surface) BS of wafer W from which titanium-containing film TF has been removed in the first process (step S21).

At this time, flake-type peeling is not occurred due to titanium-containing film TF weakened near the boundary between the portion at which titanium-containing film TF is removed (peripheral portion) and the portion at which titanium-containing film TF is not removed (central portion) in top surface (front surface) TS. Therefore, titanium-containing film TF can be etched such that the film thickness of titanium-containing film TF is decreased constantly from the portion at which titanium-containing film TF is not removed (central portion) to the portion at which titanium-containing film TF is removed (peripheral portion) in top surface (front surface) TS.

In addition, similar to the liquid processing method according to the exemplary embodiment of the present disclosure, titanium elements remaining on bottom surface (rear surface) BS of wafer W can be removed in a relatively shorter time, as compared with the case of using only first processing liquid E1 containing hydrofluoric acid, and the case of using only second processing liquid E2 containing ammonia hydrogen peroxide mixture.

Similar to second processing liquid E2, third processing liquid E3 may include ammonia hydrogen peroxide mixture SC1 including ammonia water ($NH_4OH$) and oxygenated water ($H_2O_2$). That is, third processing liquid E3 contains ammonia and hydrogen peroxide.

In terms of the concentrations of ammonia and hydrogen peroxide in third processing liquid E2, the concentration of ammonia may be 3 wt % or more, and the concentration of hydrogen peroxide may be 30 wt % or more. Further, the concentrations of ammonia and hydrogen peroxide in third processing liquid E3 may be similar to or different from the concentrations of ammonia and hydrogen peroxide in second processing liquid E2.

Further, after the third process (step S23), deionized water DIW is supplied to bottom surface (rear surface) BS of wafer W which is rotating, in the rinsing process (step S24).

In the state of rotating wafer W supported on supporting pins 35 of rotating cup 30 along with rotating cup 30, first opening/closing mechanism 11d switches so as to halt the supply of second processing liquid E2 by second processing liquid supplying unit 11b, and start the supply of deionized water DIW by deionized water supplying unit 11c. Then, deionized water DIW is supplied to bottom surface (rear surface) BS of wafer W which is rotating, by deionized water supplying unit 11c.

Further, in the modified embodiment of the present disclosure, second opening/closing mechanism 81c switches so as to halt the supply of third processing liquid E3 by second processing liquid supplying unit 81a, and start the supply of deionized water DIW by second deionized water supplying unit 81b. Then, deionized water DIW is supplied to the peripheral portion of top surface (rear surface) TS of wafer W which is rotating, by second deionized water supplying unit 81b.

After the rinsing process (step S24), wafer is dried in the drying process (step S25).

In the state of rotating wafer W supported on supporting pins 35 of rotating cup 30 along with rotating cup 30, first opening/closing mechanism 11d and second opening/closing mechanism 81c switch so as to halt the supply of deionized water DIW by deionized water supplying unit 11c and second deionized water supplying unit 81b. As a result, deionized water DIW remaining on bottom surface (rear surface) BS of wafer W and deionized water DIW remaining on the peripheral portion of top surface (front surface) TS are dusted off to the outside of the peripheral portion by centrifugal force, and hence, wafer W is spin-dried.

After the drying process (step S25), rotating cup 30 stops rotating, and therefore, wafer W supported on supporting pins 35 stops rotating as well, thereby completing the liquid processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for processing a substrate comprising:
   a first process comprising:
      supporting the substrate formed with a titanium-containing film on its front surface and rear surface by a support unit which is rotatably installed;
      rotating the substrate along with the support unit; and
      removing the titanium-containing film from the rear surface of the substrate by supplying a first processing liquid containing hydrofluoric acid to the rear surface of the substrate while rotating the substrate thereby processing the rear surface of the substrate with the first processing liquid; and
   a second process comprising:
      after the first process is completed, supplying a second processing liquid containing ammonia hydrogen peroxide mixture to the rear surface of the substrate, thereby processing the rear surface of the substrate with the second processing liquid to remove remaining particles of titanium.

2. The method of claim 1, wherein the first process removes the titanium-containing film from the rear surface of the substrate by the first processing liquid, and the second process removes the titanium element remaining on the rear surface of the substrate from which the titanium-containing film is removed, by the second processing liquid.

3. The method of claim 1, wherein the rear surface is a bottom surface of the substrate, and the front surface is a top surface of the substrate.

4. The method of claim 3, wherein the first process allows the first processing liquid supplied to the bottom surface to detour from the bottom surface to the top surface of the substrate, thereby processing a peripheral portion of the top surface with the first processing liquid; and the second process allows the second processing liquid supplied to the bottom surface to detour from the bottom surface to the top surface of the substrate, thereby processing the peripheral portion of the top surface with the second processing liquid.

5. The method of claim 4, further comprising supplying an inert gas to the top surface of the substrate while supplying the first processing liquid and the second processing liquid.

6. The method of claim 3, further comprising a third process comprising supplying a third processing liquid containing ammonia hydrogen peroxide mixture to the peripheral portion of the rotating substrate, thereby processing the peripheral portion of the top surface with the third processing liquid.

7. The method of claim 4, wherein the first process rotates the substrate along with the support unit at a first rotation speed, and supplying the first processing liquid to the bottom surface of the substrate while rotating the substrate at the first rotation speed; and the second process the substrate along with the support unit at a second rotation speed lower than the first rotation speed, and supplying the second processing liquid to the bottom surface of the substrate while rotating the substrate at the second rotation speed.

8. The method of claim 7, wherein the first rotation speed is in a range from about 1000 rpm to about 2000 rpm, and the second rotation speed is in a range from about 800 rpm to about 1400 rpm.

9. A non-transitory computer-readable recording medium storing a computer executable program that, when executed, causes a computer to perform the method of claim 1.

* * * * *